(12) United States Patent
Liu et al.

(10) Patent No.: US 6,965,504 B2
(45) Date of Patent: Nov. 15, 2005

(54) ESD PROTECTION APPARATUS AND METHOD FOR A HIGH-VOLTAGE INPUT PAD

(75) Inventors: Meng-Huang Liu, Hsinchu (TW); Chun-Hsiang Lai, Taichung (TW); Shin Su, Banchiau (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 365 days.

(21) Appl. No.: 10/304,137

(22) Filed: Nov. 26, 2002

(65) Prior Publication Data

US 2004/0052019 A1 Mar. 18, 2004

(30) Foreign Application Priority Data

Sep. 18, 2002 (TW) .............................. 91121406 A

(51) Int. Cl.[7] .............................................. H02H 3/20
(52) U.S. Cl. ....................... 361/58; 361/91.1
(58) Field of Search .............................. 361/54, 56, 58, 361/91.1, 91.5, 111, 57; 257/107, 355–362

(56) References Cited

U.S. PATENT DOCUMENTS

| 5,440,151 | A | * | 8/1995 | Crevel et al. ................ 257/173 |
| 5,502,328 | A | * | 3/1996 | Chen et al. .................. 257/546 |
| 5,986,863 | A | * | 11/1999 | Oh .............................. 361/56 |
| 6,274,909 | B1 | * | 8/2001 | Chang et al. ................ 257/355 |
| 6,788,507 | B2 | * | 9/2004 | Chen et al. ................... 361/56 |
| 6,791,146 | B2 | * | 9/2004 | Lai et al. ..................... 257/362 |

* cited by examiner

*Primary Examiner*—Brian Sircus
*Assistant Examiner*—Danny Nguyen
(74) *Attorney, Agent, or Firm*—Rabin & Berdo, P.C.

(57) ABSTRACT

An ESD protection apparatus for a high-voltage input pad comprises a modulator connected between the input pad and a snapback device with first and second guard rings surrounding the modulator, third guard ring surrounding the snapback device, and first and second guard ring control circuits to control the guard rings such that the protection apparatus has higher triggering and holding voltages under normal operation and lower triggering and holding voltages under ESD event.

17 Claims, 9 Drawing Sheets

ESD PROTECTION APPARATUS AND METHOD FOR A HIGH-VOLTAGE INPUT PAD

FIELD OF THE INVENTION

The present invention relates generally to an electrostatic discharge (ESD) apparatus and method, and more particularly to an ESD protection apparatus and method for a high-voltage input pad.

BACKGROUND OF THE INVENTION

In memory products, especially for erasable programmable read only memory (EPROM) and flash memory, high voltage has to be applied to perform special applications such as programming and erasing. However, possible overshoot might occur when the high voltage is applied, and thus the high-voltage input pad should be capable of withstanding such overshoot. On the other hand, this high-voltage input pad should also have enough ESD performance to against to electrostatic discharge that is large-current and fast-transient event.

ESD protection scheme is proposed with two well-known mechanisms, transistor turn-on and transistor snapback, where the former is characterized in the threshold voltage for channel conduction of a protection transistor and the latter is characterized in the breakdown voltage of a snapback transistor. FIG. 1 is an NMOS transistor 10 connected to be a snapback device for high-voltage input pad in prior art ESD protection circuit, whose drain is connected to the protected high-voltage input pad, and source and gate are connected together to reference, such as ground. In this snapback device 10 two important factors related to ESD performance are triggering and holding voltages. Generally, the lower the triggering and holding voltages are, the better the ESD performance is. FIG. 2 shows the current-voltage (I-V) curve of the NMOS 10. For a typical example, the NMOS 10 with a nominal high voltage A (e.g., 12.5 V) may be impressed with an overshoot B (possible up to 16 V) larger than its triggering voltage C (e.g., 14 V) and thereby triggered into its snapback mode with a low holding voltage D (e.g., 8 V). In this circumstance, the high voltage on the input pad will charge the NMOS 10 till the triggering voltage C is reached and then the NMOS 10 snaps back to the holding voltage D. Even under normal operation, unfortunately, if the NMOS 10 is accidentally triggered, it will be damaged thermally due to its holding voltage D lower than the nominal high voltage A.

Therefore, it is desired an ESD protection apparatus and method with higher triggering and holding voltages under normal operation and lower triggering and holding voltages under ESD event.

SUMMARY OF THE INVENTION

One object of the present invention is directed to an ESD protection apparatus and method for a high-voltage input pad, by which higher triggering and holding voltages are provided for normal high-voltage operation and lower triggering and holding voltages for ESD event.

An ESD protection apparatus for a high-voltage input pad, according to the present invention, comprises a modulator connected to the input pad with first guard ring surrounding the modulator and second guard ring surrounding the first guard ring, a snapback device connected between the modulator and a reference with third guard ring surrounding the snapback device, and first guard ring control circuit connected to the first and third guard rings and second guard ring control circuit connected to the second guard ring. In this invented scheme, the modulator adjusts the triggering and holding voltages of the ESD protection apparatus under the control of the first and second guard ring control circuits.

Under normal high-voltage operation, the modulator is intended to increase the triggering and holding voltages of the protection apparatus by connecting the first and third guard rings to supply voltage under control of the first guard ring control circuit and the second guard ring to ground under control of the second guard ring control circuit for the guard rings to collect the excessive minority carriers and to avoid the parasitic SCR in the circuit being triggered.

On the other hand, under ESD event the first and second guard ring control circuits control the three guard rings to be floated, such that the snapback device is easier to be triggered into its snapback mode and further to trigger the parasitic SCR between the modulator and snapback device.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
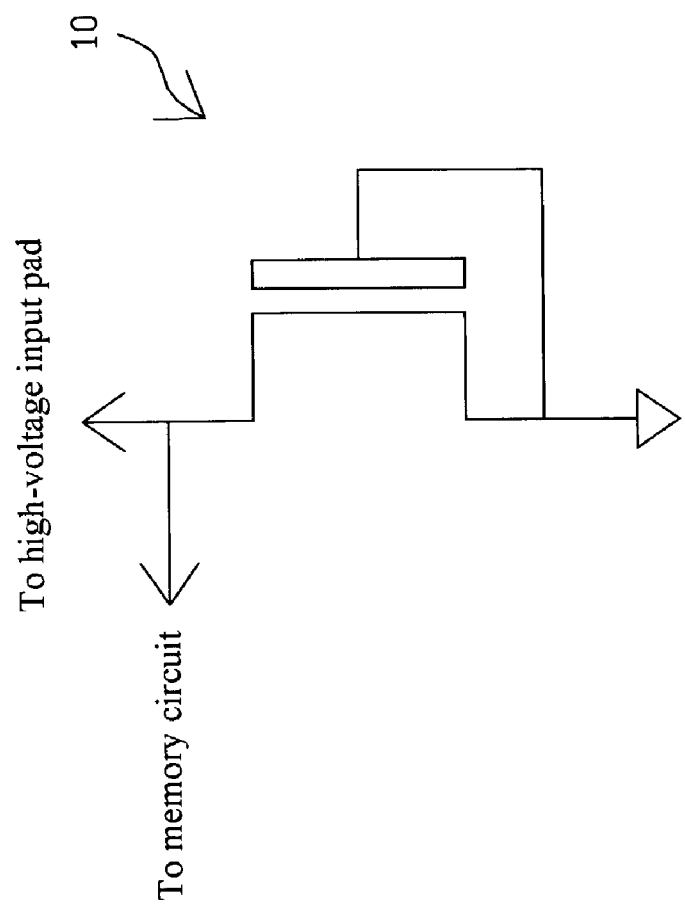
FIG. 1 is a conventional ESD protection apparatus for the high-voltage input pad.
Figure 2:
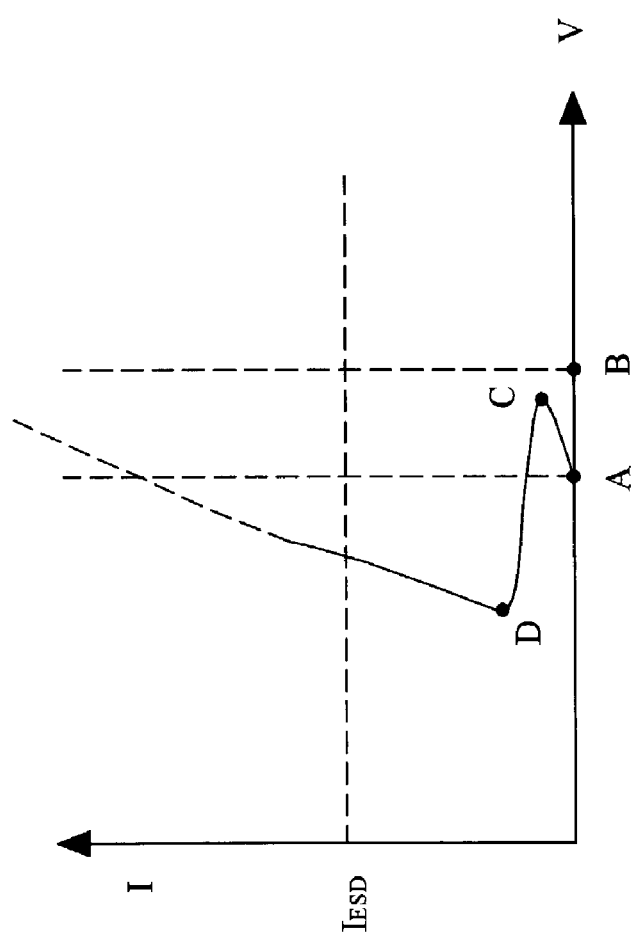
FIG. 2 is a typical I-V curve of the snapback device shown in FIG. 1.
Figure 3:
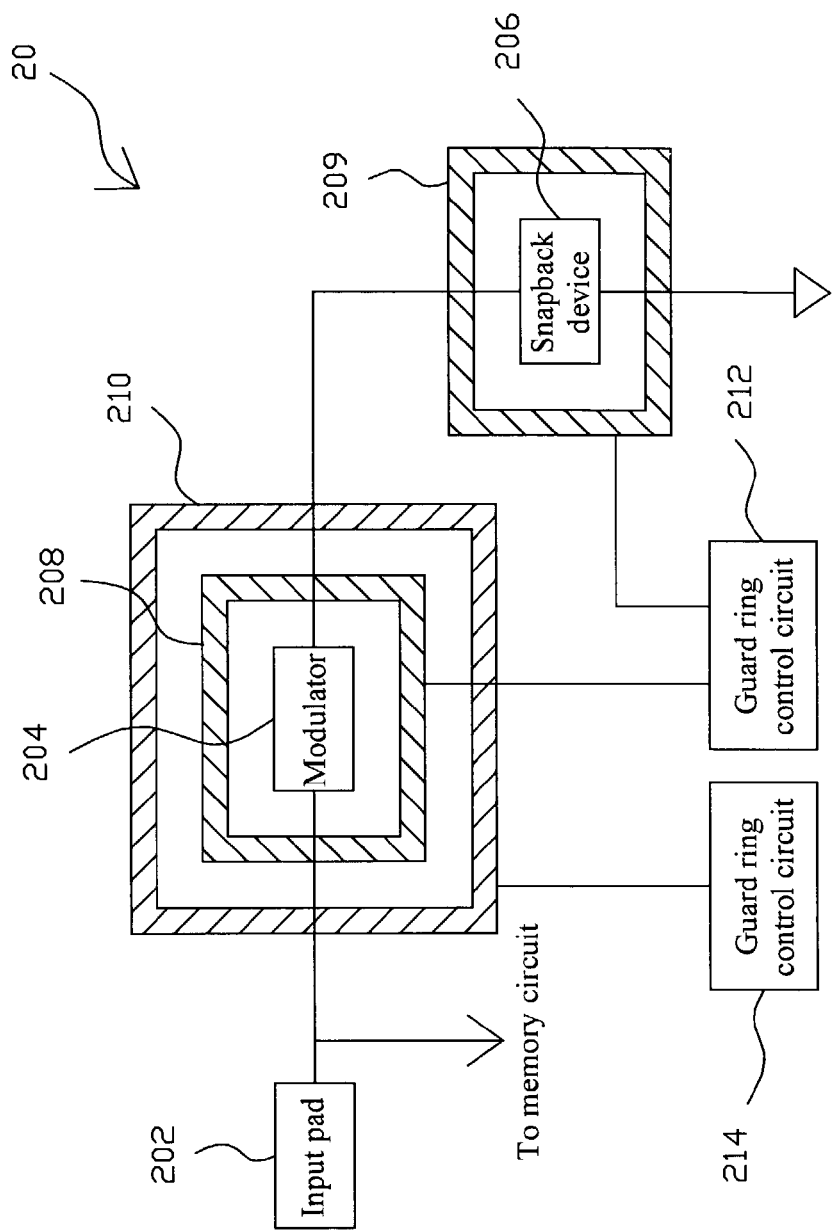
FIG. 3 is an embodiment ESD protection apparatus for a high-voltage input pad according to the present invention.

FIG. 3 shows an ESD protection apparatus 20 for a high-voltage input pad according to the present invention, in which the input pad 202 is provided to connect with an input high voltage, a modulator 204 is connected to the input pad 202, a snapback device 206 is connected between the modulator 204 and ground, guard rings 208 and 209 surround the modulator 204 and the snapback device 206, respectively, another guard ring 210 surrounds the guard ring 206, a guard ring control circuit 212 is connected to the guard rings 208 and 209, and another guard ring control circuit 214 is connected to the guard ring 210. The modulator 204 is employed to adjust the triggering and holding voltages of the ESD protection apparatus 20. The input pad 202 is connected with a high voltage under normal operation, and the modulator 204 and snapback device 206 generate a plurality of first and second excessive minority carriers, respectively, in this circumstances. In this mode the guard ring control circuits 212 and 214 control the three guard rings 208, 209 and 210 to collect the first and second excessive minority carriers and thereby to increase the triggering and holding voltages of the ESD protection apparatus 20 in association with the modulator 204 and snapback device 206, as shown by the curve 40 in FIG. 8. On the other hand, under ESD event, the guard ring control circuits 212 and 214 control the guard rings 206, 208 and 209 floated and thus the guard rings 208, 209 and 210 cannot collect carriers so as to trigger the snapback device 206. Further, a parasitical SCR is formed between the modulator 204 and snapback device 206 (not shown in FIG. 3), which is speeded up triggered by the carriers generated by the snapback device 206, as shown by the curve 50 in FIG. 8.

Figure 4:
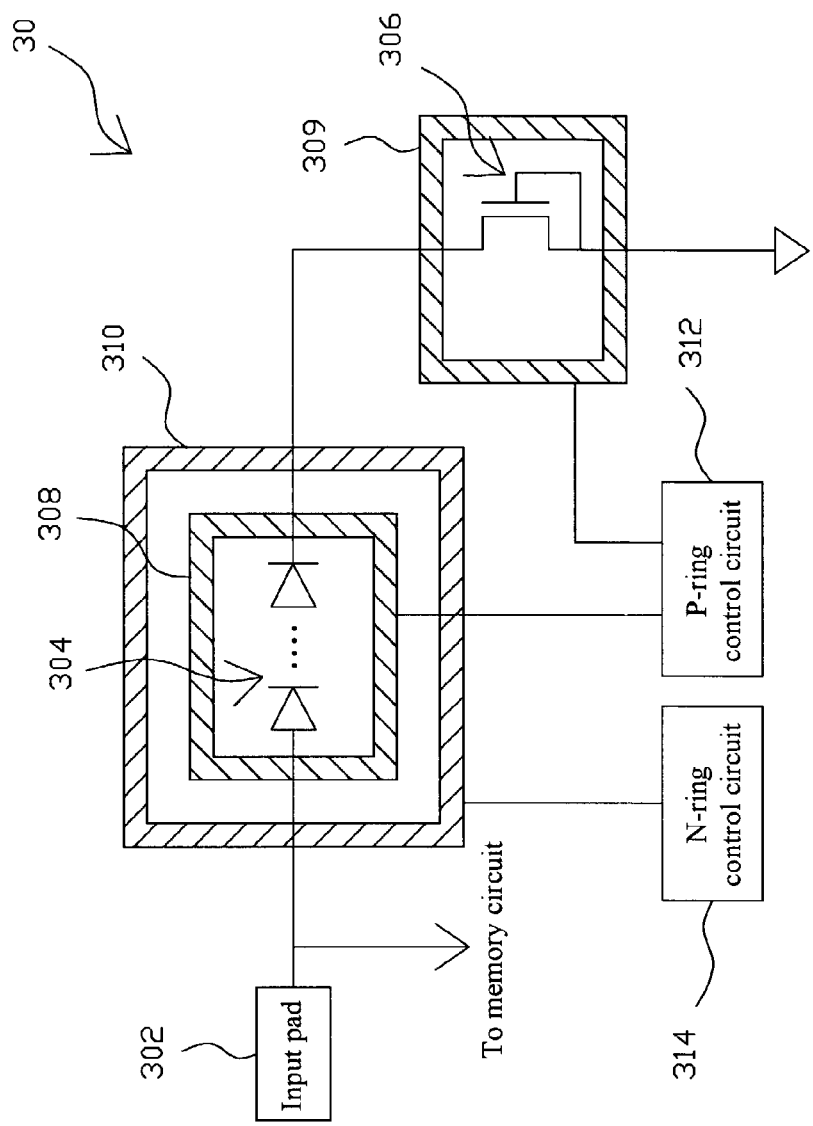
FIG. 4 is an embodiment integrated circuit for the protection apparatus of FIG. 3.
Figure 5:
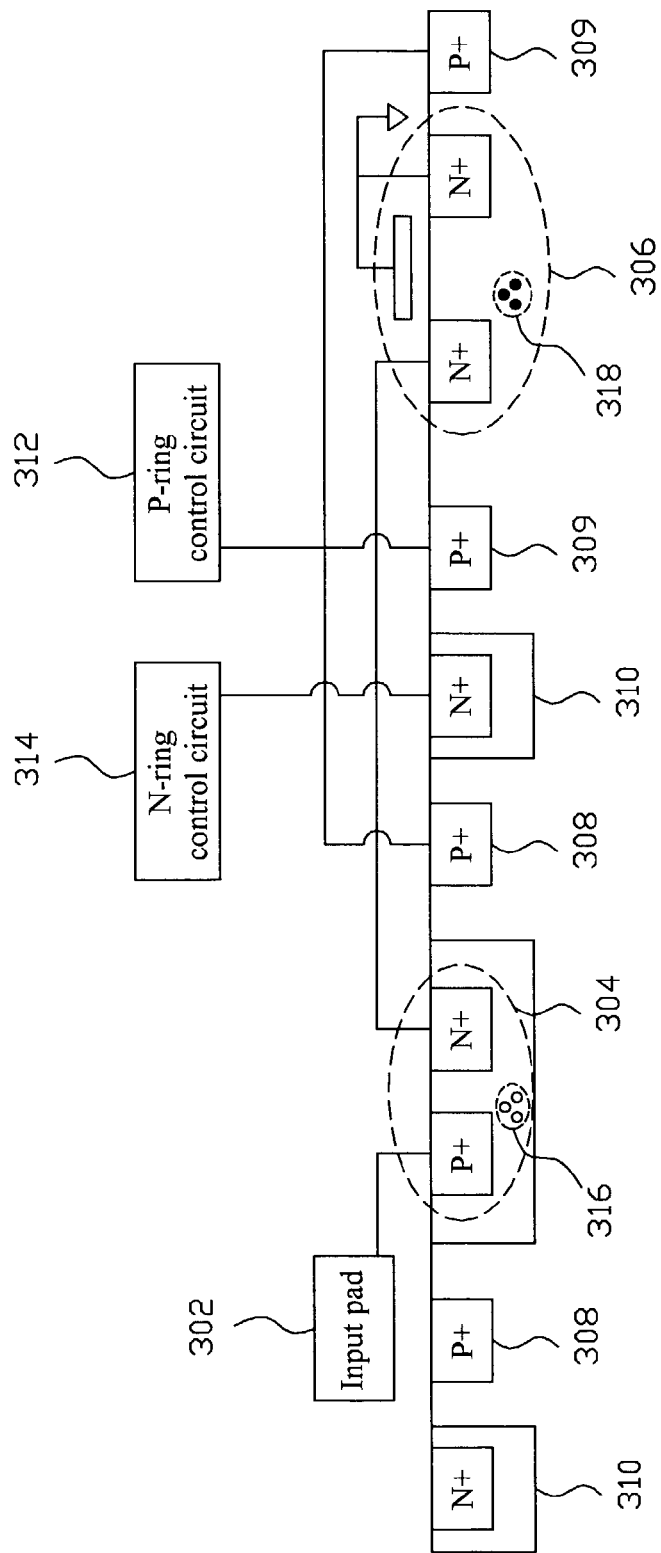
FIG. 5 is a cross-sectional view of the integrated circuit shown in FIG. 4.

FIG. 4 is an embodiment integrated circuit 30 for the protection apparatus 20 of FIG. 3 and FIG. 5 is its cross-sectional view. The ESD protection apparatus 30 comprises a diode string 304 connected to an input pad 302 with a P-ring 308 surrounding the diode string 304 and an N-ring 310 surrounding the P-ring 308, an NMOS transistor 306 with its drain connected to the output of the diode string 304 and gate and source connected together to ground and with a P-ring 309 surrounding the NMOS transistor 306, a P-ring control circuit 312 connected to the P-rings 308 and 309, and an N-ring control circuit 314 connected to the N-ring 310. The diode number in the diode string 304 has a linear relationship with the triggering and holding voltages of the protection apparatus 30 by $$V_{tc} \approx V_{tn} + n \times V_d;\text{ and}$$

$$V_{hc} \approx V_{hn} + n \times V_d,$$

where $V_{tc}$ is the triggering voltage of the protection circuit 30, $V_{tn}$ is the triggering voltage of the NMOS transistor 306, n is the diode number in the diode string 304, $V_d$ is the voltage drop of a conductive diode, $V_{hc}$ is the holding voltage of the protective circuit 30, and $V_{hn}$ is the holding voltage of the NMOS transistor 306. The more the diodes (n) are, the higher the triggering voltage $V_{tc}$ and the holding voltage $V_{hc}$ of the protective circuit 30 are, and vise versa. The high voltage connected to the input pad 302 will charge the NMOS transistor 306 through the diode string 304. If the triggering voltage $V_{tn}$ of the NMOS transistor 306 is reached, it will snap back rapidly to the holding voltage $V_{hn}$. Moreover, the diode string 304 and NMOS transistor 306 generate holes 316 and electrons 318, respectively, when connected with the input voltage, as shown in FIG. 5. It is available to modulate the triggering and holding voltages of the protection circuit 30 for normal operation and ESD event by the actions of the P-rings 308 and 309 and N-ring 310 or the actions of the holes 316 and electrons 318 under control of the guard ring control circuits 312 and 314.

Figure 6:
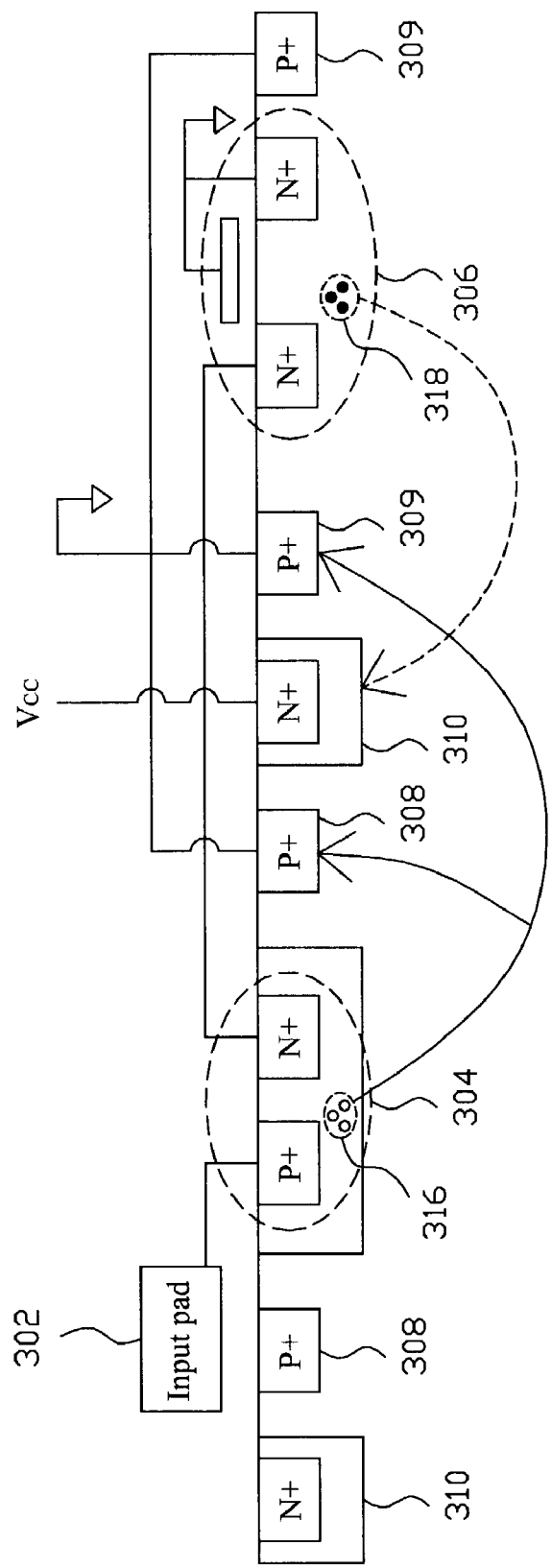
FIG. 6 illustrates the circuit of FIG. 5 under normal operation.

Under normal operation, as shown in FIG. 6, the P-rings 308 and 309 are effectively connected to ground by the P-ring control circuit 312 and the N-ring 310 is effectively connected to supply voltage Vcc by the N-ring control circuit 314. As a result, the P-rings 308 and 309 and N-ring 310 act as effective guard rings to collect excessive minority carriers including holes 316 generated by the diode string 304 and electrons 318 generated by the NMOS transistor 306 and avoid to trigger the parasitic SCR in this scheme. In the circumstances, due to the diode string 304 connected to the NMOS transistor 306 in series, the proposed circuit 30 has triggering voltage $V_{tc}$ and holding voltage $V_{hc}$ with the relationships of $$V_{tc} \approx V_{tn} + n \times V_d;\text{ and}$$

$$V_{hc} \approx V_{hn} + n \times V_d,$$

as aforementioned. Therefore, the apparatus 30 has higher triggering and holding voltages, as the curve 40 in FIG. 8, under normal operation, which are determined by the diode number (n) in the diode string 304 and the characterized voltages ($V_{tn}$ and $V_{hn}$) of the NMOS transistor 306. To increase the triggering and holding voltages to a desired level, it is only to increase the diode number in the diode string 304.

Figure 7:
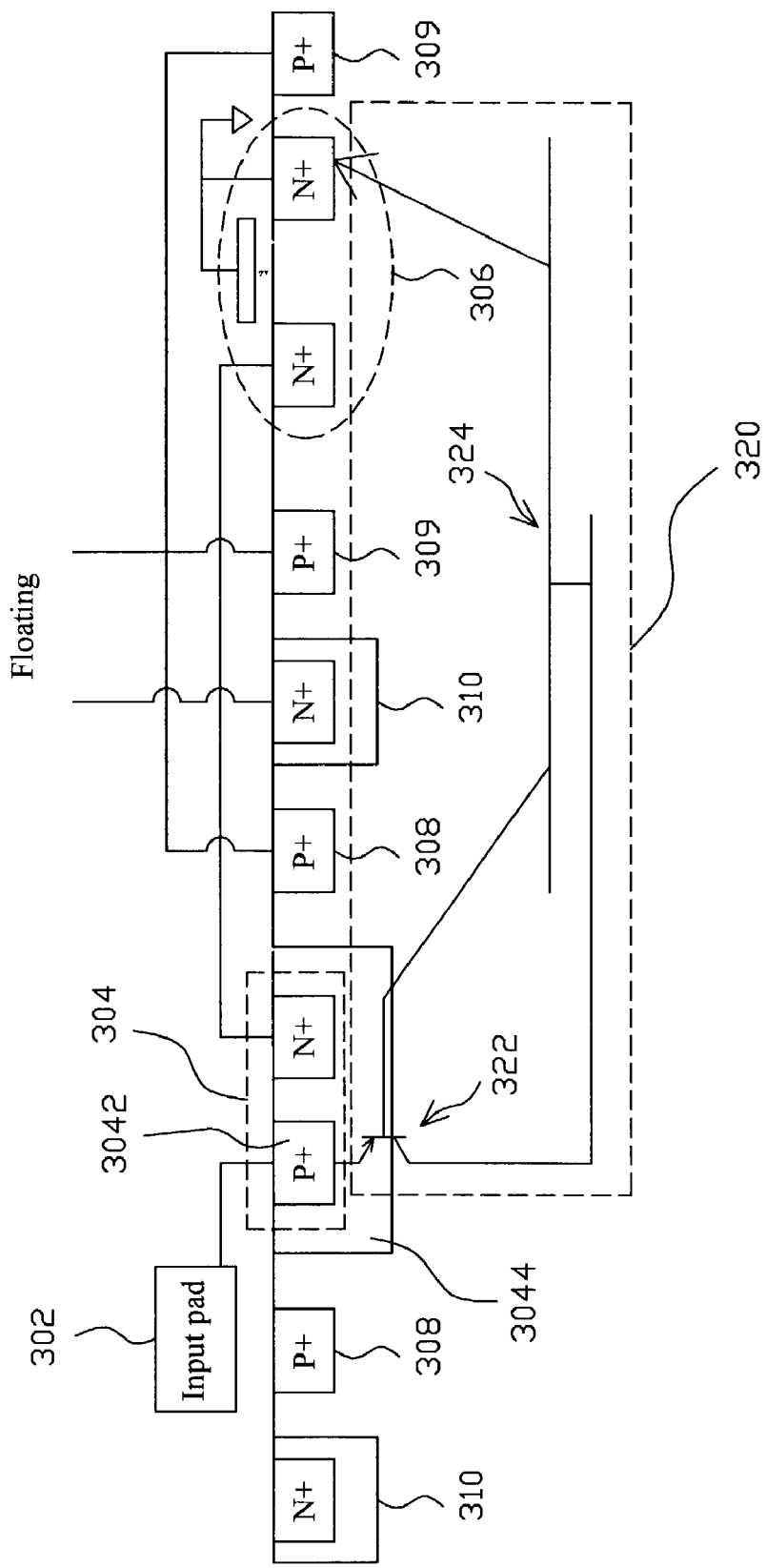
FIG. 7 illustrates the circuit of FIG. 5 under ESD event.

FIG. 7 shows the apparatus 30 under ESD event, in which the P-rings 308 and 309 and the N-ring 310 are floating under control of the P-ring control circuit 312 and N-ring control circuit 314. In this manner, the guard rings 308, 309 and 310 could not collect holes and electrons any more since they are floating. Due to the absence of effective guard ring, the holes generated by the forward-biased diode 304, which is conventionally resulted from $P^+3042$/N-well 3044 junction and now cannot not be collected by the P-rings 308 and 309, will contribute to substrate current and thus make the NMOS transistor 306 easier to be triggered into snapback. Once the NMOS transistor 306 is heavily conducted, the majority of electrons will be generated and be eventually collected by N-well 3044. The floated N-ring 310 could not collect these electrons and thus they will flow toward the N-well 3044 to form a diode. As a result, a parasitic SCR structure 320 consisted of parasitic PNP 322 and NPN 324 between the diode string 304 and the NMOS transistor 306 will be triggered, of which the PNP 322 is initially active due to the forward-biased diode. The triggered NMOS transistor 306 will provide more electrons to speed up the triggering of the SCR 320, and the low holding voltage of the SCR structure 320 makes ESD current discharged effectively. The I-V curve under this circumstance is shown by the curve 50 in FIG. 8.

Figure 8:
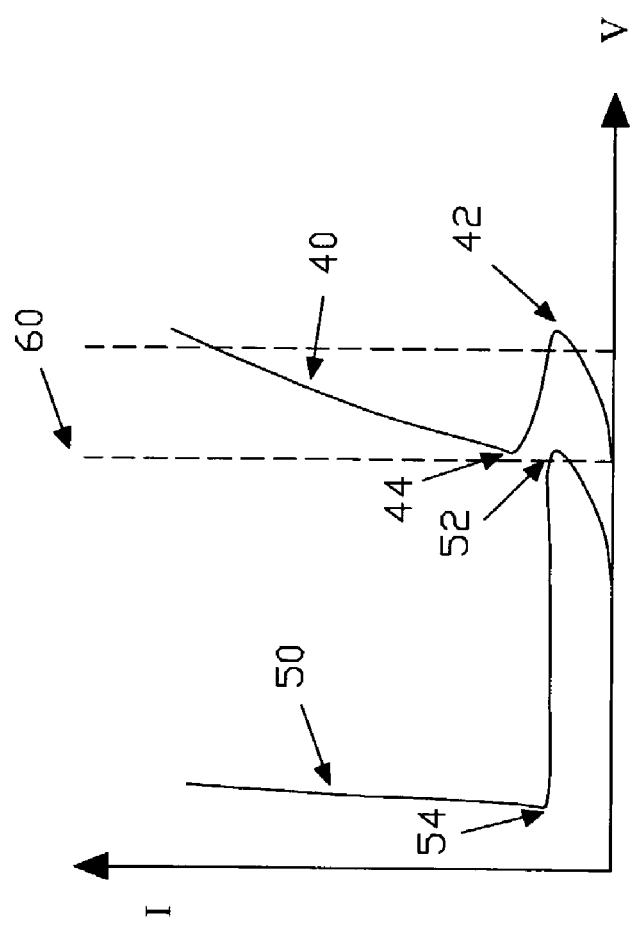
FIG. 8 shows the I-V curves for the circuits of FIG. 6 and FIG. 7.

FIG. 8 shows the I-V curves of the ESD protection apparatus 30 of FIG. 4 under normal operation and under ESD event, of which curve 40 for normal high-voltage operation and curve 50 for ESD event. Illustrated by the curve 40, the NMOS transistor 306 is hard to be undesired triggered since its triggering voltage 42 is increased higher than overshoot B. Even the NMOS 306 accidentally triggered, it will not be burnt out for its holding voltage 44 higher than the normally connected high voltage. On the other hand, the triggering voltage 52 and holding voltage 54 of the curve 50 under ESD event are much lowered, and thus better ESD performance is obtained.

Figure 9B:
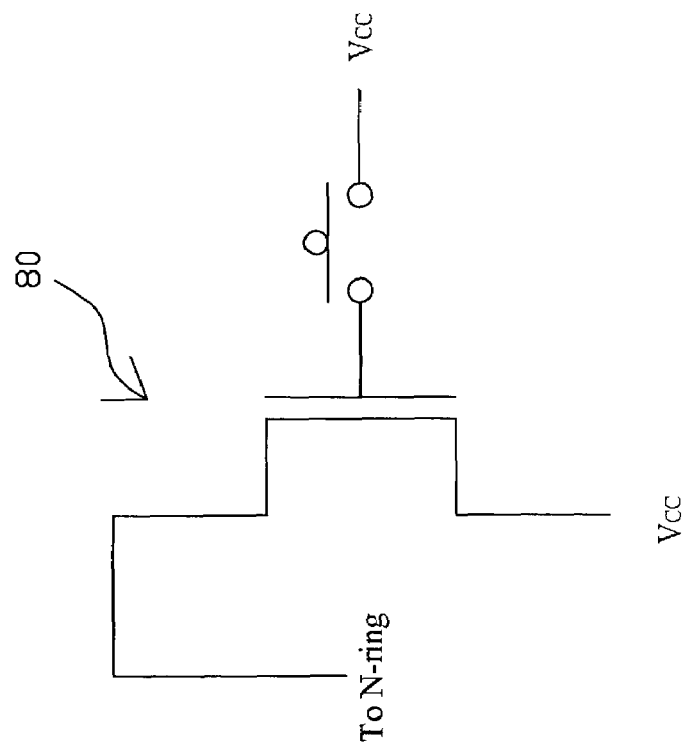
FIG. 9B is an embodiment guard ring control circuit for the N-ring in FIG. 4.
Figure 9A:
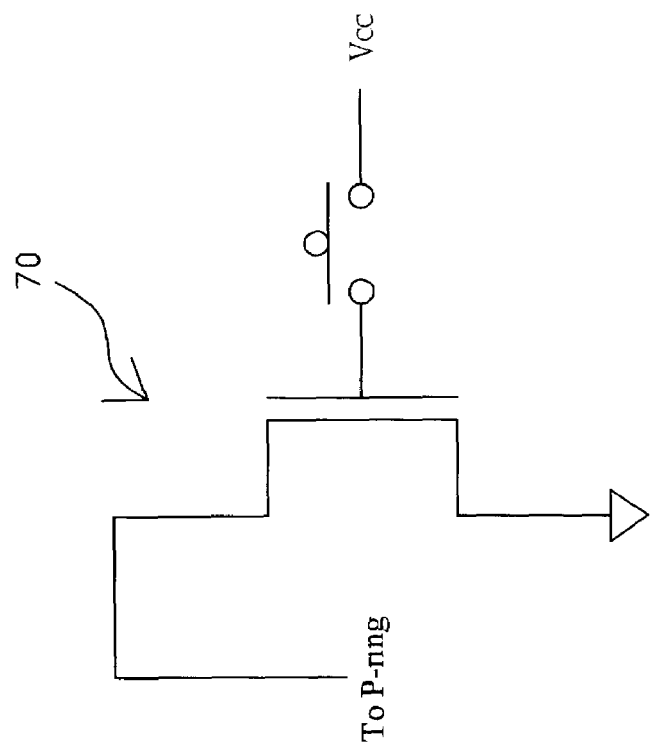
FIG. 9A is an embodiment guard ring control circuit for the P-ring in FIG. 4.

FIG. 9A is an embodiment circuit for the P-ring control circuit 312 in FIG. 4, by which an NMOS transistor 70 is used for the P-ring control circuit 312 with its drain connected to the P-rings 308 and 309, its source connected to ground, and its gate connected to supply voltage Vcc to turn the NMOS 70 to connect the P-rings 308 and 309 to ground under normal operation by a switch and floated to disconnect the P-rings 308 and 309 to ground under ESD event. FIG. 9B is an embodiment circuit for the N-ring control circuit 314 in FIG. 4, by which an NMOS transistor 80 is used for the N-ring control circuit 314 with its drain connected to the N-ring 310, its source connected to supply voltage Vcc, and its gate connected to supply voltage Vcc to turn the NMOS 80 to connect the N-ring 310 to supply voltage Vcc under normal operation by a switch and floated to disconnect the N-ring 310 to supply voltage Vcc under ESD event.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An ESD protection apparatus for a high-voltage input pad, comprising:
   a modulator connected to the input pad for adjusting a triggering voltage and a holding voltage of the protection apparatus;
   a first guard ring of a first conductivity type surrounding the modulator;
   a second guard ring of a second conductivity type opposite to the first conductivity type surrounding the first guard ring;
   a snapback device connected to the modulator;
   a third guard ring of the first conductivity type surrounding the snapback device;
   a first guard ring control circuit connected the first and third guard rings for controlling the first and third guard rings connected to a first voltage under a normal operation and floated under an ESD event; and
   a second guard ring control circuit connected the second guard ring for controlling the second guard ring connected to a second voltage under the normal operation and floated under the ESD event.

2. The apparatus of claim 1, wherein the first and third guard rings and the second guard ring are effective to collect a plurality of first and second excessive minority carriers, respectively, under the normal operation, and floated under the ESD event for reducing the triggering and holding voltages.

3. The apparatus of claim 1, wherein the modulator comprises a diode string.

4. The apparatus of claim 3, wherein the diode string includes a number of diodes connected in series, the triggering and holding voltages each having a linear relationship with the number.

5. The apparatus of claim 1, wherein the snapback device comprises an NMOS transistor.

6. The apparatus of claim 2, wherein the first carrier is hole.

7. The apparatus of claim 2, wherein the second carrier is electron.

8. The apparatus of claim 1, wherein the first conductivity type is P type.

9. The apparatus of claim 1, wherein the second conductivity type is N type.

10. The apparatus of claim 1, wherein the first guard ring control circuit comprises an NMOS transistor.

11. The apparatus of claim 1, wherein the second guard ring control circuit comprises an NMOS transistor.

12. The apparatus of claim 1, wherein the modulator and snapback device are inserted with a parasitic SCR therebetween under the ESD event.

13. The apparatus of claim 12, wherein the SCR comprises a parasitic PNP and NPN transistors.

14. An ESD protection method for a high-voltage input pad, comprising the steps of:
   connecting a modulator to the input pad for adjusting a triggering voltage and a holding voltage of the protection apparatus;
   surrounding the modulator with a first guard ring of a first conductivity type;
   surrounding the first guard ring with a second guard ring of a second conductivity type opposite to the first conductivity type;
   connecting a snapback device to the modulator;
   surrounding the snapback device with a third guard ring of the first conductivity type; and
   controlling the first and third guard rings and the second guard ring connected to a first and a second voltages, respectively, under a normal operation and floated under an ESD event for reducing the triggering and holding voltages.

15. The method of claim 14, further comprising the steps of:
   collecting a plurality of first excessive minority carriers by the first and third guard rings under the normal operation; and
   collecting a plurality of second excessive minority carriers by the second guard ring under the normal operation.

16. The method of claim 14, further comprising the steps of:
   generating a plurality of majority carriers by the snapback device under the ESD event;
   triggering a parasitic SCR between the modulator and snapback device by the plurality of majority carriers; and
   generating much more the majority carriers to thereby speed up the triggering of the SCR.

17. The method of claim 14, further comprising conducting a diode string between the input pad and snapback device for adjusting the triggering and holding voltages.

* * * * *